United States Patent [19]
Ahn et al.

[11] Patent Number: 5,816,415
[45] Date of Patent: Oct. 6, 1998

[54] INTEGRATED WAFER CASSETTE HOLDER AND WAFER CASSETTE BOX

[75] Inventors: Chung-sam Ahn, Seongnam; Sa-mun Hong, Suwon, both of Rep. of Korea

[73] Assignee: Samsung Electronics Co., Ltd., Suwon, Rep. of Korea

[21] Appl. No.: 655,123

[22] Filed: May 28, 1996

[30] Foreign Application Priority Data

Jul. 20, 1995 [KR] Rep. of Korea ................. 95-21390

[51] Int. Cl.⁶ ................................................. A47F 7/00
[52] U.S. Cl. ................................. 211/41.18; 206/454
[58] Field of Search ..................... 211/41.18; 206/454; 118/500, 728

[56] References Cited

U.S. PATENT DOCUMENTS

| | | | |
|---|---|---|---|
| 4,043,451 | 8/1977 | Johnson | 211/41.18 X |
| 4,817,795 | 4/1989 | Kos | 211/41.18 X |
| 4,858,764 | 8/1989 | Domokos | 211/41.18 X |
| 5,248,033 | 9/1993 | Kos et al. | 206/454 X |
| 5,255,797 | 10/1993 | Kos | 211/41.18 |
| 5,351,836 | 10/1994 | Mori et al. | 211/41.18 |
| 5,476,176 | 12/1995 | Gregerson et al. | 211/41.18 X |
| 5,575,394 | 11/1996 | Nyseth | 206/454 X |

*Primary Examiner*—Robert W. Gibson, Jr.
*Attorney, Agent, or Firm*—Jones & Volentine, L.L.P.

[57] ABSTRACT

The present invention provides a wafer cassette formed as an enclosed box in which a plurality of wafers may be stored and processed, and which has the capability of simultaneously serving as a wafer cassette box. The wafers are protected from contamination and damage by the enclosed box structure. An upper cover for the box structure is provided which is capable of being opened or closed while the side and bottom portions of the wafer cassette are permanently arranged in a closed position. The upper cover can be a slide type or swinging-door type structure, and the swinging-door type structure is hinge-coupled to at least one portion of the wafer cassette, preferably to at least one side portion. Thus, the total weight and volume of wafer transport and storage apparatus are reduced so that transport, storage and handling of the wafers is facilitated.

7 Claims, 7 Drawing Sheets

INTEGRATED WAFER CASSETTE HOLDER AND WAFER CASSETTE BOX

BACKGROUND OF THE INVENTION

The present invention relates to a semiconductor manufacturing apparatus, and more particularly, to a box-typed wafer cassette formed as an enclosed structure and having the capability of simultaneously serving as a wafer cassette and a wafer cassette box.

In the semiconductor industry, a wafer has to be kept in an optimally clean condition throughout the stages of a manufacturing process as well as during transportation and storage. Such is required because the yield of fabricated semiconductor devices formed on the wafer decreases whenever the wafer is exposed to dust or other contaminants. Thus, in a semiconductor manufacturing environment, a wafer cassette is used for containing and protecting the wafers in a wafer treatment manufacturing process. Also, a wafer cassette box is utilized for holding the wafer cassette and wafers to protect the wafers between stages of a wafer treatment semiconductor manufacturing process.

For illustration purposes, a conventional wafer-handling apparatus is schematically described in FIGS. 1 to 3. FIG. 1 illustrates a front view of a conventional wafer cassette having an open side 1 and a bottom 2. FIG. 2 is a front view of a closed conventional wafer cassette box, which is formed to permit insertion of a wafer cassette. FIG. 3 shows a closed conventional wafer cassette box 20 containing a conventional wafer cassette 10 (dashed-line), which wafer cassette had been placed inside an open conventional wafer cassette box and the box closed.

As described above, the wafer cassette is transported and stored while inside the wafer cassette box. For various semiconductor manufacturing process stages, the wafers are taken out by hand or machine from the wafer cassette and the wafer cassette is returned to the wafer cassette box while the wafer is being subjected to a process stage. With wafers requiring the use of such handling equipment including using both the wafer cassette and the wafer cassette box, the wafers are hard to transport due to the heaviness of the cassette box which contains the wafer cassette and wafers. This problem becomes even more serious for larger wafers.

Further, since the wafers are stored contained within the relevant wafer cassette box along with the wafer cassette, wafer storage efficiency is reduced. Also, the requirement during stages of the manufacturing process to frequently remove the wafer cassette from the wafer cassette box to obtain the wafers and to then place the wafer cassette back into the wafer cassette box is cumbersome.

Moreover, in the course of all of the above, the probability is that the wafer is likely to become contaminated. Such contamination would result in a serious degradation of the yield and quality of semiconductor devices.

Meanwhile, when a robot is employed to manipulate the wafer cassette, an additional apparatus, e.g., a wafer cassette opener, is necessary to remove the wafer cassette from the wafer cassette box. Accordingly, additional cost and more space in a clean room are required to store the wafer cassettes and wafer cassette box during such processes. Also, in such an automated system, an additional recognition system, such as a bar code, should be attached to each of the wafer cassettes and their corresponding wafer cassette boxes for recognizing and identifying the same. This further burdens management of the recognition portion of the automated system.

As seen from the above discussion, the conventional wafer-handling apparatus consists of two parts, i.e., the wafer cassette and the wafer cassette box. There are several problems in using such a wafer-handling apparatus including: excess volume and weight of the apparatus, increased cost for the separate handling, a reduction in productivity and storage efficiency, and an increased likelihood of contamination.

SUMMARY OF THE INVENTION

To solve the above problems, it is an object of the present invention to provide a wafer cassette having the capability of serving the combined functions of a wafer cassette and wafer cassette box.

Accordingly, to achieve the above object, there is provided a wafer cassette arranged as an enclosed structure and capable of containing a plurality of wafers for processing and storage, said enclosed structure comprising an upper cover capable of being open or closed and comprising side and bottom portions which are permanently arranged in a closed position to protect wafers from contamination and damage, wherein said wafer cassette is arranged to be capable of simultaneously serving as a wafer cassette box.

It is preferred that the enclosed structure is formed as a box and said upper cover is slidably connected to said side portions to permit opening and closing of the enclosed structure. Also preferred is an upper cover formed as a swinging-door type being hinge-coupled to the body of the wafer cassette body, preferably hinge-coupled to a side portion of the wafer cassette.

BRIEF DESCRIPTION OF THE DRAWINGS

The above object and advantages of the present invention will become more apparent by describing in detail preferred embodiments thereof with reference to the attached drawings in which.

DETAILED DESCRIPTION OF THE INVENTION

Figure 1:
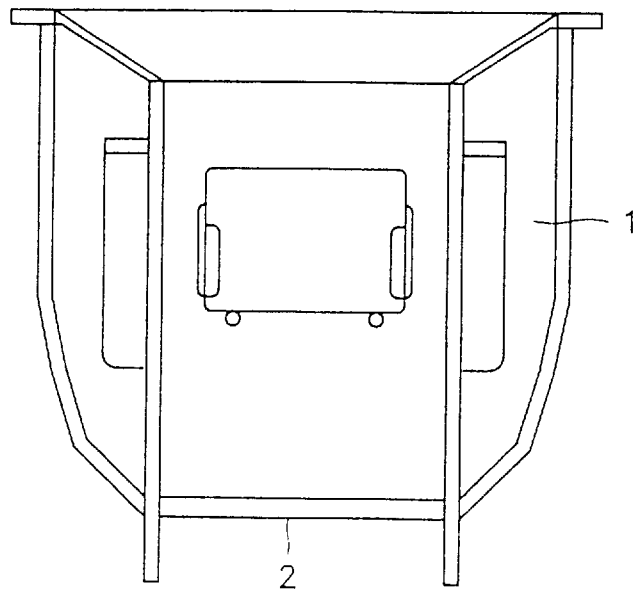
FIG. 1 is a front view of a conventional wafer cassette.
Figure 2:
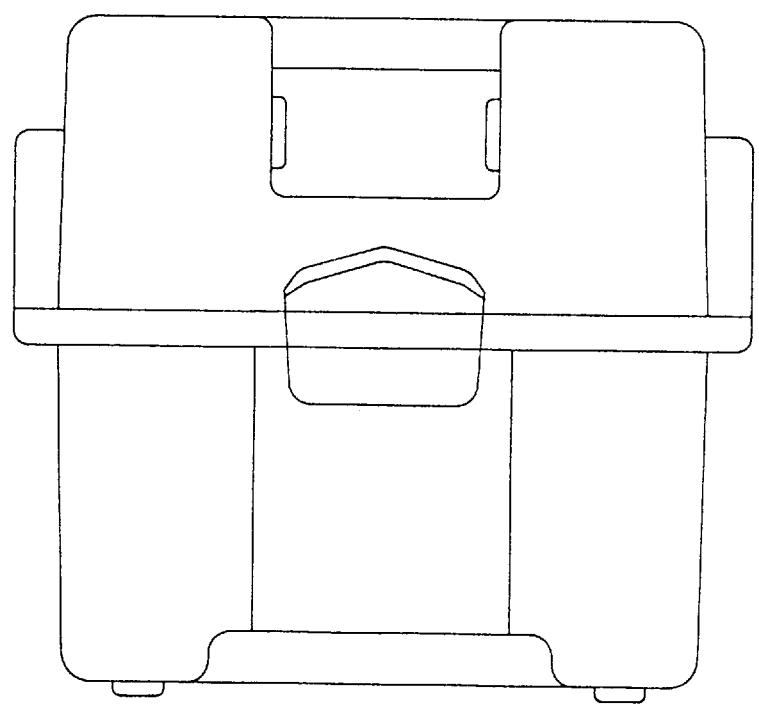
FIG. 2 is a front view of a conventional wafer cassette box.
Figure 3:
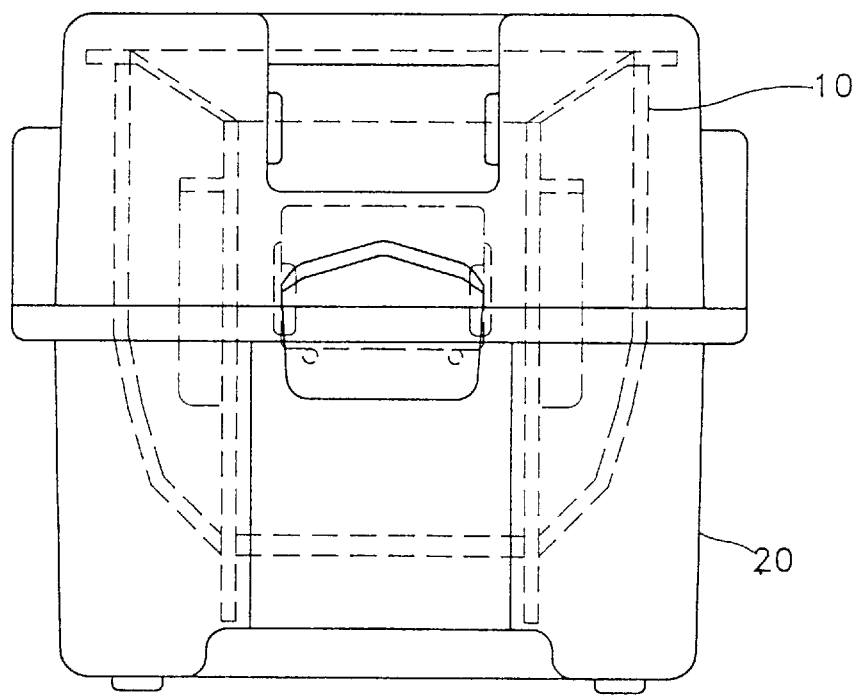
FIG. 3 is a front view of a wafer cassette box of FIG. 2, having the wafer cassette of FIG. 1 placed therein.
Figure 4:
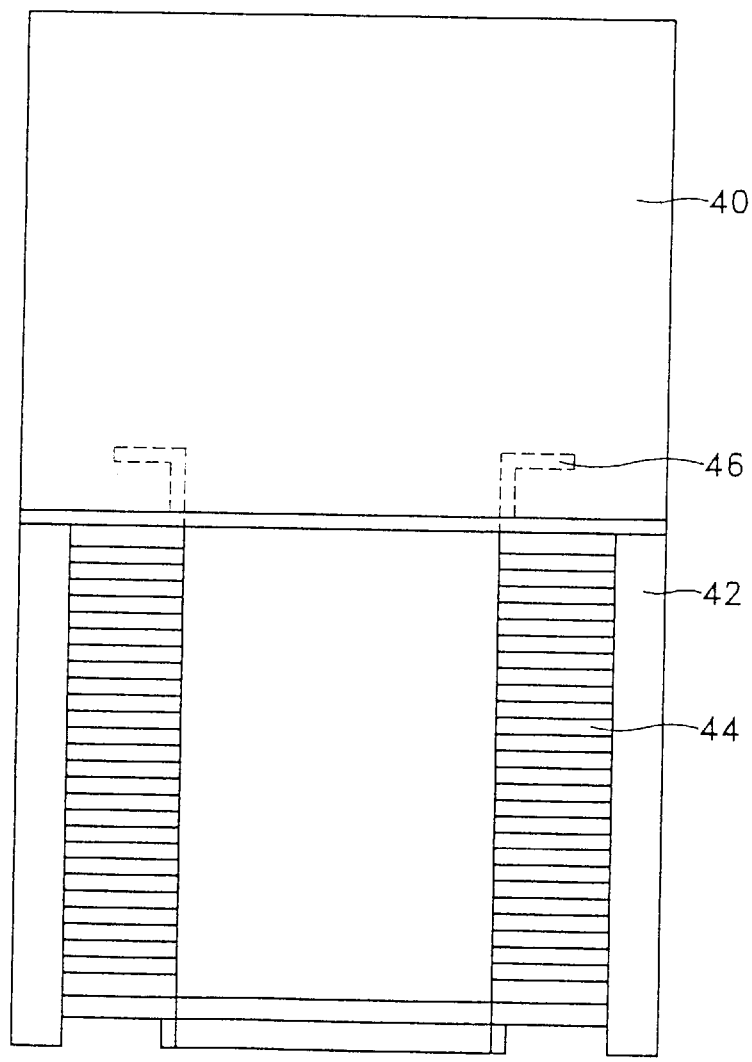
FIG. 4 is a top view of a box-typed wafer cassette according to a first embodiment of the present invention.
Figure 5:
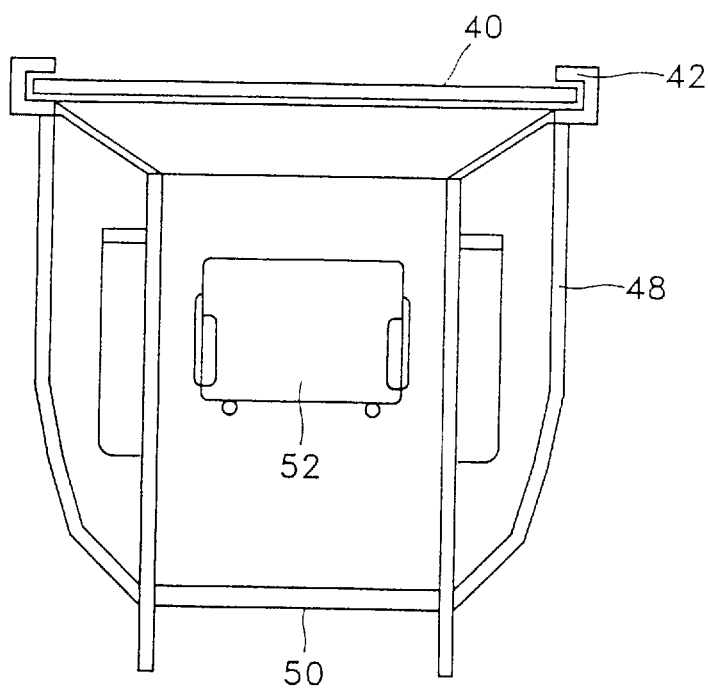
FIG. 5 is a front view of a box-typed wafer cassette according to a first embodiment of the present invention.
Figure 6:
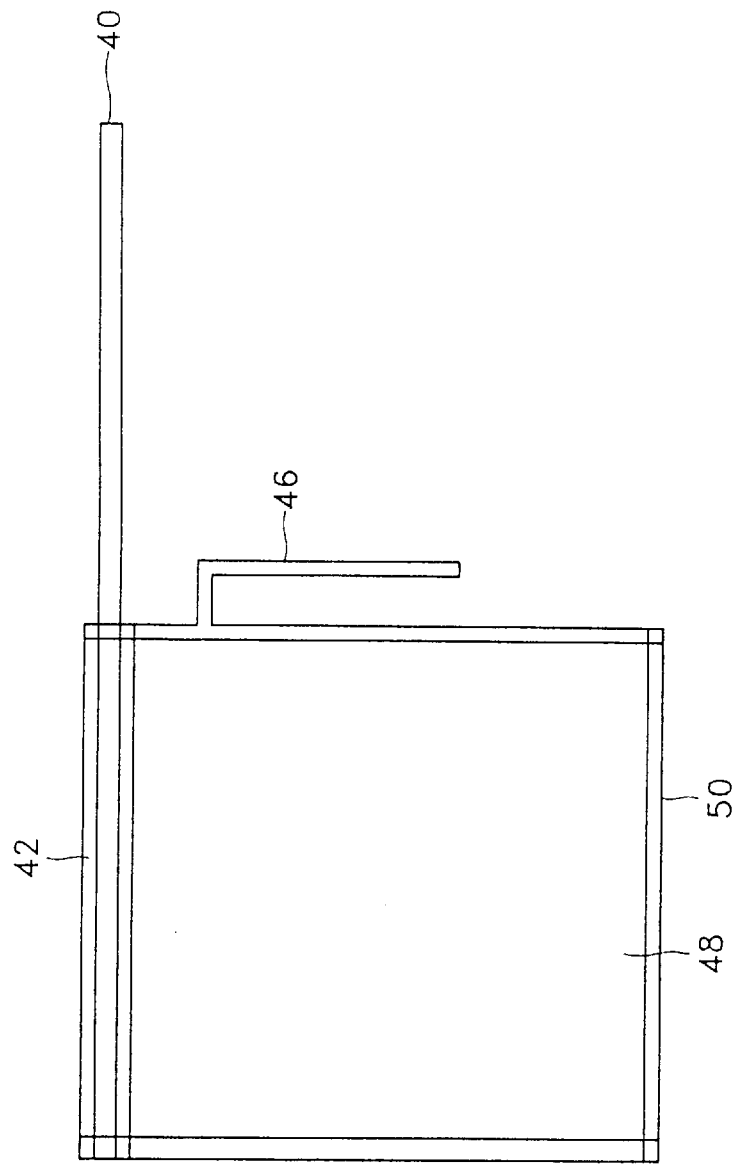
FIG. 6 is a right side view of a box-typed wafer cassette according to a first embodiment of the present invention.

FIGS. 4 to 6 each show a box-typed wafer cassette according to a first embodiment of the present invention.

FIG. 4 is a top view of wafer cassette according to the first embodiment of the present invention, wherein the wafer cassette is arranged as an enclosed structure and capable of containing a plurality of wafers, and the wafer cassette is also arranged to be capable of simultaneously serving as a wafer cassette box. In FIG. 4, a reference numeral 40 denotes a slide cover at the top position of the wafer cassette;

a reference numeral 42 denotes a groove for slidably fitting slide cover 40; a reference numeral 44 denotes a wafer deck into which at least one wafer may inserted; and a reference numeral 46 denotes a carrier grip which facilitates the handling and operating of the wafer cassette by automated equipment.

FIG. 5 is a front view of the wafer cassette according to the first embodiment of the present invention. Therein, reference numerals 48 and 50 denote side and bottom wall portions of the wafer cassette, which is formed as a box. The wafer cassette is provided with cover portion 40, which together with side wall portion 48 and bottom wall portion 50, can minimize the inflow of dust and other contaminants during semiconductor manufacturing processes. A reference numeral 52 is a recognition plate of the wafer cassette.

FIG. 6 is a right side elevational view of the wafer cassette according to the first embodiment of the present invention. Therein, reference numerals which are the same as those of FIGS. 4 and 5 denote the same structures described for FIGS. 4 and 5. Due to side and bottom wall portions 48 and 50, the box-typed wafer cassette according to the first embodiment of the present invention is arranged to be capable of serving as a wafer cassette box.

Figure 7:
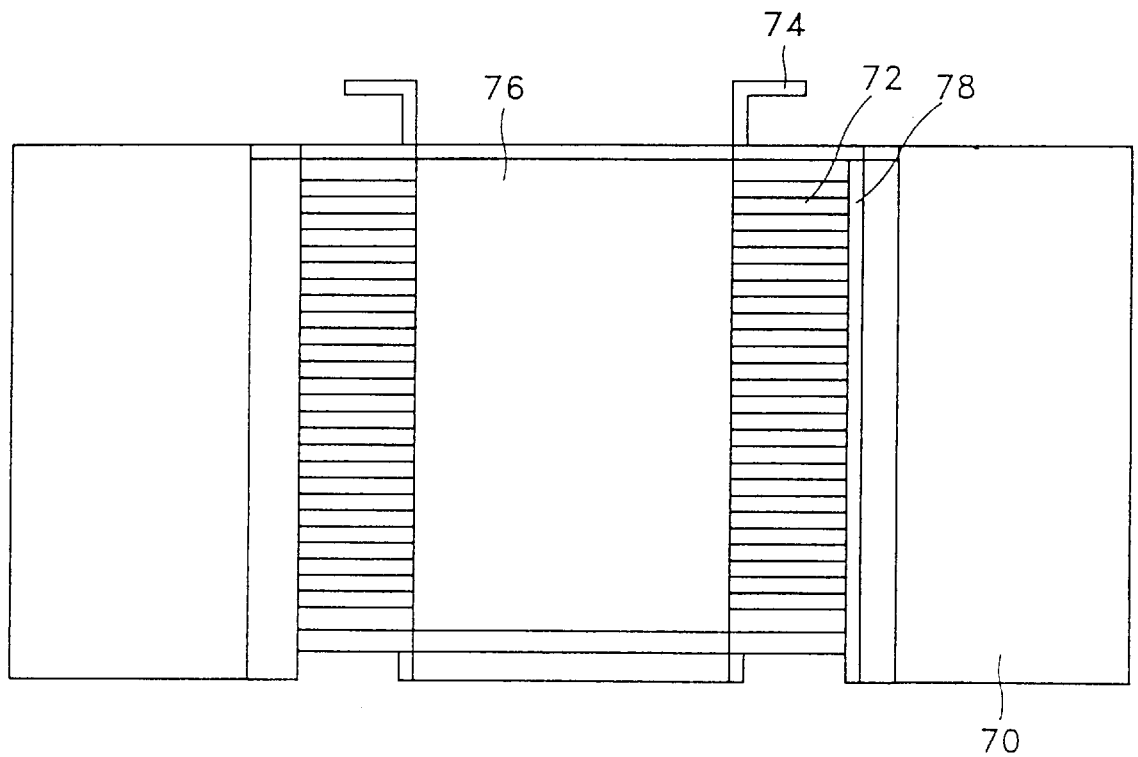
FIG. 7 is a top view of a box-typed wafer cassette according to a second embodiment of the present invention.
Figure 8:
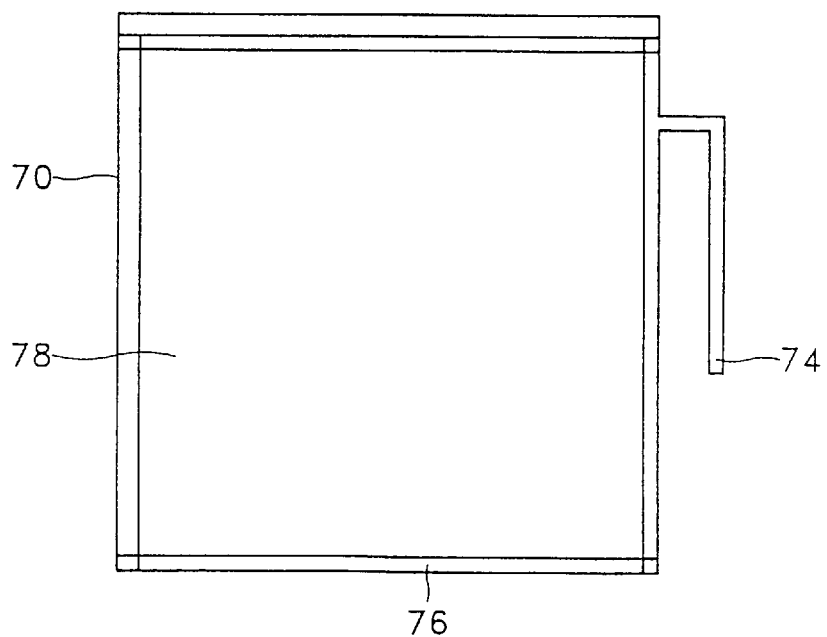
FIG. 8 is a right side view of a box-typed wafer cassette according to a second embodiment of the present invention.
Figure 9:
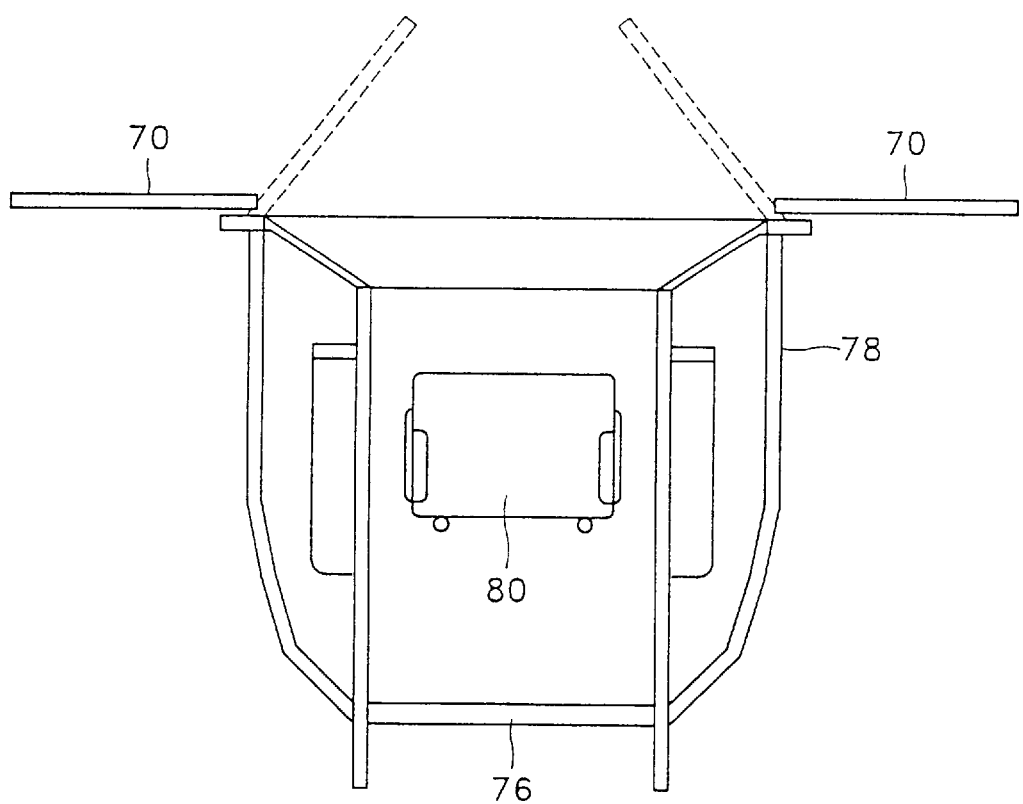
FIG. 9 is a front view of a box-typed wafer cassette according to a second embodiment of the present invention.

An example of the second embodiment of the present invention is described by referring to FIGS. 7 to 9. The reference numerals in FIGS. 7–9 which are also present in FIGS. 4–6 denote like components as described for FIGS. 4–6.

FIG. 7 is a top view of the wafer cassette according to the second embodiment of the present invention, wherein the wafer cassette is arranged as an enclosed structure and capable of containing a plurality of wafers, and the wafer cassette is also arranged to be capable of simultaneously serving as a wafer cassette box. In FIG. 7, a reference numeral 70 denotes an upper cover portion of a 2-piece swinging-door type which is hinge-coupled to the wafer cassette body in such a manner as to be capable of the swinging on its hinge to be open or closed. The swinging door typed cover portion serves the same function as the slide-type cover portion denoted by reference numeral 40 of the first embodiment. A reference numeral 72 denotes a wafer deck into which at least one wafers may be inserted; a reference numeral 74 denotes a carrier grip portion of the wafer cassette; and reference numerals 76 and 78 denote bottom and side wall portions of the wafer cassette, respectively.

FIG. 8 is a right side view of the wafer cassette according to the second embodiment of the present invention.

FIG. 9 is a front view of the wafer cassette according to the present invention. A reference numeral 80 denotes a recognition plate of the wafer cassette.

In the wafer-handling apparatus according to the first and second embodiments of the present invention, such as described above, the weight and volume of the apparatus thereof are less than that of the conventional apparatuses. The lesser weight facilitates the transportation, storage and handling of the wafers and their protective and storage apparatus.

According to the present invention, the removal of the wafer cassette and its placement into the wafer cassette box become unnecessary, enhancing productivity and reducing the potential for contamination. Further, no additional space is required for storing an empty box left during a process stage. In addition, the process of identifying the wafer cassette box becomes unnecessary because an automatic recognition apparatus is attached only to the box-typed wafer cassette.

It is noted that the present invention is not limited to the preferred embodiment described above, and it is apparent that variations and modifications by those skilled in the art can be effected within the spirit and scope of the present invention defined in the appended claims.

What is claimed is:

1. A wafer cassette holder arranged as an enclosed structure and capable of containing a plurality of wafers for processing and storage, said enclosed structure comprising an upper cover capable of being opened or closed and comprising side and bottom portions which are permanently arranged in a closed position to protect wafers from contamination and damage, wherein said wafer cassette holder is arranged to be capable of simultaneously serving as a wafer cassette box.

2. A wafer cassette according to claim 1, wherein said enclosed structure is formed as a box and said upper cover is slidably connected to said side portions to permit opening and closing of the enclosed structure.

3. A wafer cassette according to claim 1, wherein said enclosed structure is formed as a box and said upper cover is hinge-coupled to at least one portion of said box to permit opening and closing of the enclosed structure.

4. A wafer cassette according to claim 3, wherein said upper cover contacts a top surface of each of said side portions when said upper cover is in a closed position, each of said top surfaces being in substantially the same plane.

5. A wafer cassette according to claim 4, wherein said upper cover is formed in first and second sections, said first section having one edge hinge-coupled to the top surface of one of said side portions and said second section having one edge hinge-coupled to the top surface of the other of said side portions.

6. A wafer cassette arranged as an enclosed structure and capable of containing a plurality of wafers for processing and storage, said enclosed structure comprising an upper cover capable of being opened or closed and comprising side portions and bottom portions which are permanently arranged in a closed position to protect wafers from contamination and damage, wherein said wafer cassette is arranged to be capable of simultaneously serving as a wafer cassette box, and wherein said upper cover is slidably connected to said side portions to permit opening and closing of the enclosed structure.

7. A wafer cassette according to claim 6, wherein said upper cover slides in grooves formed on each of said side portions.

* * * * *